TRANSISTORIZED SYMMETRICAL DIFFERENTIAL
ALTERNATING CURRENT AMPLIFIER

Filed June 22, 1961

INVENTORS
C.W. SEM-JACOBSEN
N.E. KAISER
BY Wade Koontz
ATTORNEY
and
James S. Shannon
AGENT 3,153,203

TRANSISTORIZED SYMMETRICAL DIFFERENTIAL ALTERNATING CURRENT AMPLIFIER

Carl Wilhelm Sem-Jacobsen, P.O. Box 103, Rochester, Minn., and Niels Edmund Kaiser, Linde Alle 36, Copenhagen, Denmark Filed June 22, 1961, Ser. No. 118,924
5 Claims. (Cl. 330—30)

Figure 1:
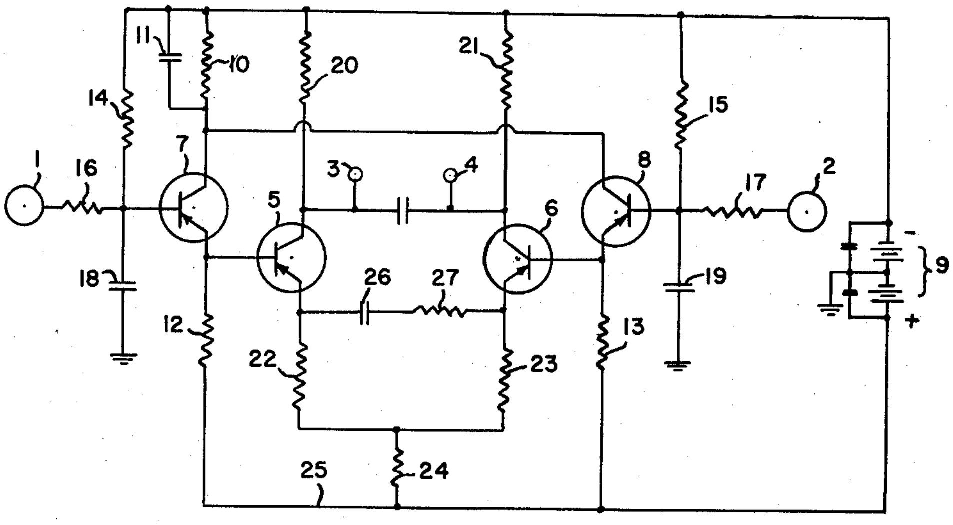

The purpose of this invention is to provide a miniaturized differential amplifier having a high in-phase rejection factor, a stable gain, a relatively high input impedance, a low power requirement and low inherent noise. The small size, low power requirements and inherent ruggedness of the amplifier make it particularly suited for use in equipment to be carried by air or space vehicles, an example being its use as a signal amplifier in an electroencephalograph for recording the effect of high G-forces or other stresses on consciousness.

The requirement for small size dictates the use of transistors rather than vacuum tubes. However, the stabilization of symmetrical differential transistor amplifiers where high in-phase rejection factor, constant gain, low noise and high input impedance are of major importance presents difficulties. The use of a common emitter resistor similar to the common cathode resistor used in vacuum tube differential amplifiers is not suitable for transistor differential amplifiers since the common resistor does not provide the required degree of direct current stabilization of the transistors. In accordance with the invention, separate emitter resistors are used to provide adequate stabilization of the working points against temperature changes, etc. and a network consisting of a resistor and a capacitor connected in series is connected between the emitters to reduce the signal degeneration and consequent loss of gain that would otherwise result from the separate emitter resistors. The series resistor in the network is for the purpose of adjusting the signal degeneration to a suitable amount as required for gain stabilization, distortion reduction and input impedance adjustment. Although signal degeneration is small, this arrangement, like the common emitter resistor, provides strong degeneration of in-phase components with consequent improvement in the in-phase rejection factor of the amplifier.

Because of gain reduction and inherent noise level considerations the resistor in the R–C network between the emitters normally will not exceed 1000 ohms. For the amplification of biopotentials such, for example, as potentials resulting from the activity of the brain, the time constant of the amplifier should be 0.1 second or more. As the itme constant of the amplifier is limited by the time constant of the R–C network between the emitters, it follows that the capacitor in this network must have a capacitance of about 100 $\mu f$. If the amplifier is to be miniaturized this necessitates the use of electrolytic capacitors since the physical size of other types, such as ceramic, paper and plastic-foil, is much too great. The use of electrolytic capacitors for alternating current requires a direct polarizing potential of sufficient magnitude that the polarity at the capacitor terminals never reverses. Therefore, as a further feature of the invention, provision is made for supplying the required polarization when electrolytic capacitors are used in the R–C network between the emitters.

Figure 2:
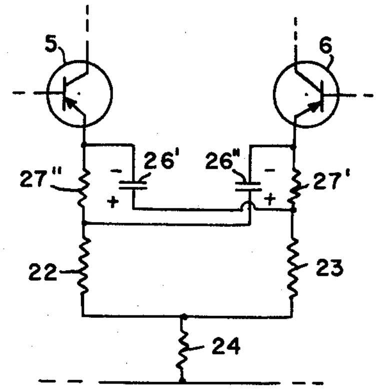

The invention will be described in more detail with respect to the specific embodiment thereof shown in the accompanying drawing, in which FIG. 1 is a schematic diagram of a transistorized differential amplifier embodying the invention, and FIG. 2 shows how the amplifier of FIG. 1 may be modified in accordance with the invention to permit the use of electrolytic capacitors in the R–C network connected between the emitters.

Referring to the drawing, the differential amplifier schematically shown in FIG. 1 is particularly suited to use as a signal amplifier in an electroencephalograph. The elements 1 and 2 represent the input electrodes to be attached to the subject and between which the biopotentials resulting from brain activity are developed. The amplified signals appear at output terminals 3–4. Differentially connected transistors 5 and 6 are the amplifying elements. Transistors 7 and 8 are connected as emitter followers and serve as coupling devices between electrodes 1 and 2 and transistors 5 and 6, respectively. The entire circuit is symmetrical with respect to ground.

Considering the circuit in more detail, power is supplied by direct current source 9 which has its electrical center connected to ground. The source should have a low impedance to currents of the signal frequency as indicated by the shunt capacitors. The emitter follower stages containing transistors 7 and 8 are identical, the two transistors having a common collector resistor 10, bypassed for the signal by capacitor 11, equal emitter resistors 12 and 13, and equal base resistors 14 and 15. These resistors are so selected as to bias the emitter-base junctions of the two transistors to proper operating points. Equal resistors 16 and 17 together with equal capacitors 18 and 19 form filters for high frequency interference. As is apparent from the symmetry of the circuit, the input signal voltage between electrodes 1 and 2 divides into two equal oppositely phased parts, one part appearing between the base of transistor 7 and ground and the other between the base of transistor 8 and ground, and is thus introduced into the emitter-base circuits of these transistors for controlling the potentials across the emitter-base junctions. The output signals of the emitter-follower stages, which appear across resistors 12 and 13, are equal in magnitude and opposite in phase. Since these resistors are included in the emitter-base or input circuits of transistors 7 and 8, the full output signals are fed back negatively to the input circuits. This results in a slightly less than unity gain for each of the emitter-follower stages and an increase in the input impedances of the stages. In addition, the direct current feedback produced by resistors 12 and 13 effectively stabilizes the operating points and quiescent currents of transistors 7 and 8.

The equal magnitude oppositely phased signals across resistors 12 and 13 are the input signals to the differential amplifier of which transistors 5 and 6 are the amplifying elements. These transistors have equal collector resistors 20 and 21, equal emitter resistors 22 and 23, and a common emitter resistor 24. The direct emitter currents of transistors 5 and 6 flow separately in resistors 22 and 23 and together in resistor 24. Resistors 22 and 23 provide individual direct current stabilization of the two transistors by the process of direct current negative feedback. Common resistor 24 may be decreased, to zero if necessary, with a corresponding increase in resistors 22 and 23 as required to provide the proper degree of direct current or working point stabilization.

In addition to direct current stabilization it is desired that the network connected between the emitters of transistors 5 and 6 and conductor 25 provide either zero or a controlled small amount of degeneration of the desired signal but a large amount of degeneration of spurious in-phase signals. A small amount of degeneration of the true signal may be desired for stabilizing the gain, improving linearity, increasing the input impedance, etc. A large amount of degeneration for in-phase signals is desired to improve the in-phase rejection factor of the differential amplifiers. In the circuit so far described, however, a high degeneration of both the desired and undesired signal would occur. The purpose of condenser 26 and resistor 27, connected in series between the emitters, is to reduce the degeneration of the desired signal without impairing the degeneration of the in-phase spurious signal.

Considering first the desired signal appearing between electrodes 1 and 2, this signal, as stated above, divides into two equal oppositely phased parts which appear across resistors 12 and 13 and constitute the input signals to the differentially connected transistors 5 and 6. These signals produce equal oppositely phased emitter currents in the transistors. If resistor 27 has zero resistance and if capacitor 26 is large enough to have substantially zero reactance at the signal frequency, the emitter current of each transistor divides equally between resistors 22 and 23. Consequently the signal currents in resistors 22 and 23 cancel and there is no signal voltage developed across these resistors. Also the signal currents that flow in resistor 24 are equal and oppositely phased so that the signal current in and the signal voltage across this resistor are zero. Consequently, there is no degeneration of the desired signal when resistor 28 is zero.

A small amount of degeneration of the signal may be accomplished by giving resistor 27 a resistance value greater than zero. In this case the transistor 5 emitter current in resistor 22 is slightly greater than the transistor 6 current in this resistor due to the presence of resistor 27. Similarly, the transistor 6 emitter current in resistor 23 slightly exceeds the transistor 5 emitter current in this resistor. Consequently, the residual emitter currents in resistors 22 and 23 produce small amounts of signal degeneration in the individual stages depending upon the size of resistor 27.

The presence of condenser 26 and resistor 27 does not interfere with the degeneration of the in-phase spurious signals. These signals result from pickup of radio or other electrical interference by the subject to which electrodes 1 and 2 are attached and cause an in-phase variation of the potentials of these electrodes relative to ground. As a result, the emitter currents of transistors 5 and 6 flowing through resistors 22, 23 and 24 are of the same phase and therefore add, rather than cancel as in the case of the desired signal. This results in spurious signal voltages being developed across resistor 22, 23 and 24 which are fed back negatively to the input circuits of transistors 5 and 6. This reduces the gains of these stages to the spurious signal and thereby contributes to an improvement of the in-phase rejection factor of the amplifier. The principal in-phase rejection, of course, results from the differentially connected circuit.

As previously mentioned, the amplifier, when used in an electroencephalograph, should have a time constant not less than 0.1 second. Since resistor 27 would not normally have a value greater than about 1000 ohms, this requires a capacitor 26 of 100 $\mu$f. The only capacitors of this capacitance having small enough physical size for use in a miniaturized amplifier are of the electrolytic type. Since the polarity at the terminals of an electrolytic capacitor should not be permitted to reverse, as would occur in the case of capacitor 26 in FIG. 1, this circuit must be modified to provide a polarizing potential of the proper magnitude if an electrolytic capacitor is to be employed. FIG. 2 shows the proposed modification of FIG. 1 for this purpose. In this arrangement, two identical series R-C circuits are connected in parallel between the emitters of transistors 5 and 6, and it is arranged for the emitter currents to pass through the series resistors to produce the required polarizing potentials. Electrolytic capacitor 26′ and resistor 27′ constitute one of the series circuits and electrolytic capacitor 26″ and resistor 27″ constitute the other. Two circuits are used to preserve the circuit symmetry. The quiescent emitter currents flowing in resistors 27′ and 27″ produce the required biasing potentials which must not be of lesser magnitude than the signal potentials at the capacitor terminals in order to insure against reversals of polarity. Although two series circuits as described above are preferred in order to preserve the symmetry of the amplifier circuit, in cases where a small amount of dissymmetry can be tolerated satisfactory results may be obtained with a single R-C series circuit, in which case either of the series circuits 26′–27′ and 26″–27″ may be omitted and the other retained.

Electrically, the performance of the circuit of FIG. 2 is very similar to that of FIG. 1. Considering the desired signal, the emitter current of transistor 5 flows through resistor 24 and then divides, one part flowing through resistor 23 and capacitor 26′ to the emitter and the other part flowing through resistors 22 and 27″ to the emitter. Since the path through resistors 22 and 27″ has slightly higher impedance than the path through resistor 23 and capacitor 26′, the transistor 5 signal current in resistor 22 is slightly less than the transistor 5 signal current in resistor 23. For the same reasons, the transistor 6 signal current in resistor 23 is slightly less than the transistor 6 signal current in resistor 22. Since the emitter currents of the two transistors are equal and oppositely phased, complete cancellation occurs in resistor 24, somewhat less than complete cancellation occurs in resistors 22 and 23 and no cancellation occurs in resistors 27′ and 27″. Therefore, for the desired signal, no feedback voltage is developed across resistor 24; small regenerative feedback voltages are developed across resistors 22 and 23 due to the residual signal currents in these resistors, and larger degenerative feedback voltages are developed across resistors 27′ and 27″. As a result, the net effect is a degenerative feedback the magnitude of which depends upon the size of resistors 27′ and 27″.

We claim:

1. A differential amplifier for alternating current signals comprising: a pair of transistors each having emitter, base and collector electrodes; a source of direct current; equal collector resistors connected between the collector electrodes of said transistors and one terminal of said source; equal unbypassed emitter resistors connected between the emitter electrodes of said transistors and the other terminal of said source; a pair of input terminals between which the signal to be amplified is applied; means for splitting the input signal between said input terminals into two equal magnitude oppositely phased components and for applying one component between the base of one transistor and said other source terminal and the other component between the base of the other transistor and said other source terminal; means for connecting an output circuit between the collector electrodes of said transistors; and a capacitor and a resistor connected in series between said emitters, said series connected resistor being proportioned with respect to said emitter resistors to reduce the signal degeneration produced by said emitter resistors to a small amount and said capacitor being proportioned relative to said series connected resistor so that the series combination of said capacitor and resistor has a time constant appropriate for the signal.

2. A differential amplifier for alternating current signals comprising: a pair of transistors each having emitter, base and collector electrodes; a source of direct current; equal collector resistors connected between the collector electrodes of said transistors and one terminal of said source; equal unbypassed emitter resistors connected between the emitter electrodes of said transistors and the other terminal of said source; a pair of input terminals between which the signal to be amplified is applied; means for splitting the input signal between said input terminals into two equal magnitude oppositely phased components and for applying one component between the base of one transistor and said other source terminal and the other component between the base of the other transistor and said other source terminal; means for connecting an output circuit between the collector electrodes of said transistors; and means providing a pair of identical parallel current paths between the emitters of said transistors, each path consisting of an electrolytic capacitor and a resistor connected in series between said emitters, the series resistor of one path being connected between the emitter and the emitter resistor of one transistor and the series resistor of the other path being connected between the emitter and the emitter resistor of the other transistor whereby the quiescent emitter currents flowing through said series resistors provide polarizing potentials for said electrolytic capacitors, said series resistors being proportioned with respect to said emitter resistors to reduce the signal degeneration produced by said emitter resistors to a small amount and each of said electrolytic capacitors being proportioned relative to the resistor connected in series with it so that each of said parallel current paths has a time constant appropriate for the signal.

3. A differential amplifier for alternating current signals comprising: a pair of transistors each having emitter, base and collector electrodes; a source of direct current; equal collector resistors connected between the collector electrodes of said transistors and one terminal of said source; equal unbypassed emitter resistors connected between the emitter electrodes of said transistors and the other terminal of said source; a pair of input terminals between which the signal to be amplified is applied; means for splitting the input signal between said input terminals into two equal magnitude oppositely phased components and for applying one component between the base of one transistor and said other source terminal and the other component between the base of the other transistor and said other source terminal; means for connecting an output circuit between the collector electrodes of said transistors; and an electrolytic capacitor having one terminal connected to the emitter of one transistor and its other terminal connected through an additional resistor to the emitter of the other transistor, said additional resistor also being included in the emitter circuit of the said other transistor between the emitter and the emitter resistor whereby the quiescent emitter current flowing in said additional resistor provides a polarizing potential for the electrolytic capacitor, said additional resistor being proportioned with respect to said emitter resistors to reduce the signal degeneration produced by said emitter resistors to a small amount and said electrolytic capacitor being proportioned relative to said additional resistor so that the series combination of these two elements has a time constant appropriate for the signal.

4. A differential amplifier for alternating current signals comprising: a first pair of transistors each having emitter, base and collector electrodes; a source of direct current having a low impedance to said signals; equal collector resistors connected between the collector electrodes of said transistors and one terminal of said source; equal unbypassed emitter resistors connected between the emitter electrodes of said transistors and the other terminal of said source; a second pair of transistors each having emitter, base and collector electrodes; a connection having a low impedance to the signal between the collectors of said second pair of transistors and the said one terminal of said source; equal resistors connected between the bases of said second pair of transistors and the said one terminal of said source; equal resistors connected between the emitters of said second pair of transistors and the said other terminal of said source; a conductive connection between the emitter of one of said second pair of transistors and the base of one of said first pair of transistors and a like conductive connection between the emitter of the other of said second pair of transistors and the base of the other of said first pair of transistors; a capacitor and a resistor connected in series between the emitters of said first pair of transistors, said series connected resistor being proportioned with respect to the emitter resistors of said first pair of transistors to reduce the signal degeneration produced by the emitter resistors of said first pair of transistors to a small amount and said capacitor being proportioned relative to said series connected resistor so that the series combination of said capacitor and resistor has a time constant appropriate for the signal; a pair of input terminals between which said signals to be amplified are applied, one of said terminals being connected to the base of one of said second pair of transistors and the other being connected to the base of the other of said second pair of transistors; and means for connecting an output circuit between the collector electrodes of said first pair of transistors.

5. A differential amplifier for alternating current signals comprising: a first pair of transistors each having emitter, base and collector electrodes; a source of direct current having a low impedance to said signals; equal collector resistors connected between the collector electrodes of said transistors and one terminal of said source; equal unbypassed emitter resistors connected between the emitter electrodes of said transistors and the other terminal of said source; a second pair of transistors each having emitter, base and collector electrodes; a connection having a low impedance to the signal between the collectors of said second pair of transistors and the said one terminal of said source; equal resistors connected between the bases of said second pair of transistors and the said one terminal of said source; equal resistors connected between the emitters of said second pair of transistors and the said other terminal of said source; a conductive connection between the emitter of one of said second pair of transistors and the base of one of said first pair of transistors and a like conductive connection between the emitter of the other of said second pair of transistors and the base of the other of said first pair of transistors; a pair of identical parallel current paths between the emitters of said first pair of transistors, each path consisting of an electrolytic capacitor and a resistor connected in series between said emitters, the series resistor of one path being connected between the emitter and the emitter resistor of one transistor and the series resistor of the other path being connected between the emitter and the emitter resistor of the other transistor, whereby the quiescent emitter currents flowing through said series resistors provide polarizing potentials for said electrolytic capacitors, said series resistors being proportioned with respect to the emitter resistors of said first pair of transistors to reduce the signal degeneration produced by the emitter resistors of said first pair of transistors to a small amount and each of said electrolytic capacitors being proportioned relative to the resistor connected in series with it so that each of said parallel current paths has a time constant appropriate for the signal; a pair of input terminals between which said signals to be amplified are applied, one of said terminals being connected to the base of one of said second pair of transistors and the other being connected to the base of the other of said second pair of transistors; and means for connecting an output circuit between the collector electrodes of said first pair of transistors.

References Cited in the file of this patent

UNITED STATES PATENTS

| | | |
|---|---|---|
| 2,979,665 | Schayes | Apr. 11, 1961 |
| 3,003,113 | MacNichol | Oct. 3, 1961 |
| 3,078,377 | Brunschweiger | Feb. 19, 1963 |